United States Patent [19]

Coon et al.

[11] Patent Number: 4,873,555
[45] Date of Patent: Oct. 10, 1989

[54] INTRABAND QUANTUM WELL PHOTODETECTOR AND ASSOCIATED METHOD

[75] Inventors: Darryl D. Coon, Pittsburgh, Pa.; Runkiri P. Karunasiri, Sherman Oaks, Calif.; Hui C. Liu, Pittsburgh, Pa.

[73] Assignee: University of Pittsburgh of the Commonwealth System of Higher Education, Pittsburgh, Pa.

[21] Appl. No.: 58,972

[22] Filed: Jun. 8, 1987

[51] Int. Cl.$^4$ .................. H01L 27/12; H01L 49/02; H01L 29/161; H01L 29/72

[52] U.S. Cl. .................................... 357/4; 357/16; 357/30; 357/34

[58] Field of Search .............. 357/4, 16, 30 E, 30 P, 357/34

[56] References Cited

U.S. PATENT DOCUMENTS

| | | | |
|---|---|---|---|
| 4,499,590 | 2/1985 | Bluzer | 377/60 |
| 4,503,447 | 3/1985 | Iafrate et al. | 357/16 |
| 4,575,922 | 3/1986 | Reed et al. | 357/16 |
| 4,602,352 | 7/1986 | Coon et al. | 365/114 |
| 4,603,401 | 7/1986 | Coon | 365/114 |

FOREIGN PATENT DOCUMENTS

| | | | |
|---|---|---|---|
| 0068064 | 1/1983 | European Pat. Off. | 357/4 |
| 0159273 | 10/1985 | European Pat. Off. | 357/4 |
| 589363 | 8/1981 | Japan . | |

OTHER PUBLICATIONS

Sollner et al., "Resonant Tunneling through Quantum Wells at Frequencies up to 2.5 THz", Appl. Phys. Lett., vol. 43 (6) 9-15-1983, pp. 588-590.
Sollner et al., "Quantum Well Oscillators", Appl. Phys. Lett., vol. 45, No. 12, 12-15-1984, pp. 1319-1321.
Yokoyoma et al., "A New Functional, Resonant-Tunneling Hot Electron Transistor (RHET)", Japanese Journal of Applied Physics, vol. 24, No. 11, 11-1985, pp. L853-L854.
Morkoc et al., "Observation of a Negative Differential Resistance Due to Tunneling through a Single Barrier into a Quantum Well", Appl. Phys. Lett., vol. 49, No. 2, 7-14-1986, pp. 70-72.
Capasso et al., "New Avalanche Multiplication Phenomenon in Quantum Wells Perlattices: Evidence of Impact Ionization Across the Band Edge Discontinuity", Appl. Phys. Lett., vol. 48, No. 19, 5-12-1986, pp. 1294-1296.
Tsuchiya et al., "Dependence of Resonant Tunneling Current on Well Widths in AlAs/GeAs/AlAs Double Barrier Diode Structures", Appl. Phys. Lett., vol. 49, No. 2, 7-14-1986, pp. 88-90.
Fast Response Quantum Well Photodectors, D. D. Coon, et al., June 13, 1986.
Journal Applied Physics, pp. 2636-2638. vol. 60, No. 7.
Tunneling Currents and Two-Body Effects in Quantum Well and Superlattice Structures, Applied Physics Letter, vol. 47, No. 2, Jul. 15, 1987, pp. 172-174.
Tunneling in a Finite Superlattice, R. Tsu and L. Esaki, Applied Physics Letter, vol. 22, No. 11, Jun. 1, 1973, pp. 562-564.
Infrared Optical Devices of Layered Struture, L. L. Chang, et al., Oct. 1977, vol. 20, No. 5, IBM Technical Disclosure Bulletin.

Primary Examiner—Eugene R. LaRoche
Assistant Examiner—Michael Shingleton
Attorney, Agent, or Firm—Arnold B. Silverman; Richard V. Westerhoff

[57] ABSTRACT

A fast, real time method and apparatus for long wavelength infrared photodetection employs a quantum well from which stored electrons are ejected by photoemission and replaced by electrons which tunnel through a barrier bounding one side of the quantum well. The photodetector comprises a semiconductor device having a quantum well layer separated from an emitter layer on one side by a first barrier layer and from a collector layer on the other side by a second barrier layer. The first barrier is higher than the second which in turn is higher than the Fermi level in the quantum well layer. Photons excite electrons in the quantum well to an excited state from which they flow over the second barrier to the collector layer. Electrons tunnel from the emitter through the first barrier to the quantum well at the rate at which they are depleted by photoemission so that the detector is suitable for use with high pulse rate digital communication signals.

18 Claims, 2 Drawing Sheets

INTRABAND QUANTUM WELL PHOTODETECTOR AND ASSOCIATED METHOD

BACKGROUND OF THE INVENTION

1. Field of the Invention

The present invention relates to apparatus and a method for converting light signals into electrical signals. More particularly, it is related to a semiconductor photodetector device especially suitable for converting high frequency electromagnetic radiation signals, particularly long wavelength infrared signals, into electrical signals using a quantum well.

2. Background Information

In known photodetectors, the photons excite electrons in the valence band of the semiconductor material causing them to jump from the valence band to the conduction band. Such devices are termed "interband" photodetectors as electrons are excited from one band, the valence band, to a second band the conduction band. Such prior art devices are useful at short wavelengths.

One application of such prior art photodetectors is as a receiver in digital communications systems using fiber optic channels. In the systems, digital data, and or, voice or video data converted to digital signals, generate light pluses which are transmitted over the fiber optic channels. Typically, such light is produced by a laser in the infrared range. As improvements in optical fiber technology have occurred, it has become possible to increase the number of light pluses per second that may be transmitted to where it is now possible to transmit pulsed light signals at rates in excess of one gigahertz (GHz) with a strong trend toward higher rates. Due to losses in the fiber optics at short wavelengths in the near infrared region, it is necessary in such systems to provide repeaters which adds to the cost and complexity of the system.

Advances in fiber optic technology are leading to the development of long wavelength, low loss optical fibers which are much more suitable for long distance communication. Unfortunately, the "interband" photodetectors which are useful at short wavelengths are less suitable for long wavelength data communication.

There exists, therefore, a real need for fast response, long wavelength photodetector which is capable of rapidly converting light signals into electrical signals.

It is therefore a primary object of the invention to provide an apparatus and method capable of converting long wavelength light signals into electrical signals.

It is another important object of the invention to provide an apparatus and method capable of converting long wavelength light into electrical signals at high pulse rates with minimal error.

SUMMARY OF THE INVENTION

These and other objects are realized by apparatus and a method in which stored electrons ejected by photons from a quantum well bounded by asymmetrical barriers flow over the lower barrier and are replaced by electrons which tunnel through the higher barrier, preferably at a rate at least as great as the rate at which they are depleted by photoemission.

The apparatus takes the form of a photodetector comprising multiple layers of semiconductor materials including a quantum well layer between an emitter layer and a collector layer, with a first barrier layer between the quantum well layer and the emitter layer, and a second barrier layer between the quantum well layer and the collector. The first barrier layer has a conduction band edge height establishing a first energy barrier which is higher than the conduction band edge height of a second energy barrier established by the second barrier layer which in turn is higher than the Fermi level of the quantum well. Photons excite electrons from the Fermi level in the quantum well layer to an excited state which is approximately at the level of the conduction band edge height of the second barrier layer so that electrons flow from the quantum well through the second barrier layer but over the second energy barrier to the collector. The thickness of the first barrier layer and height of the first energy barrier is such that electrons that are depleted from the quantum well layer by photoemission, are replaced by electrons which tunnel from the emitter through the first barrier layer. The band edge height of the first barrier layer and its thickness are preferably selected such that electrons tunnel from the emitter through the first barrier layer to the quantum well layer at a rate which is at least as great as the rate at which the electrons are depleted from the quantum well by photoemission. Also, preferably, the emitter layer is doped, and the band edge height and thickness of the first barrier layer are such that the Fermi levels of the emitter layer and the quantum well layer equilibrate. Furthermore, it is preferred that the thickness of the second barrier layer be selected to provide a selected balance between low detector capacitance and low electron transit time, and that the collector layer be doped and of a thickness selected to provide, with the second barrier layer, a selected RC time constant for the photodetector.

In a preferred form of the invention the layers of semicondcutor materials are grown on a substrate from materials consisting essentially of gallium, arsenic and aluminum using known techniques such as molecular beam epitaxy or metalorganic chemical vapor deposition. Either the emitter layer or the collector layer, but preferably the latter, may serve as the substrate. The substrate is needed to give structural integrity to the very thin layers of the device. In a preferred form, the quantum well layer comprises essentially gallium arsenide, GaAs, and the other layers are metal alloys of gallium arsenide and aluminum arsenide with the relative proportions selected to provide the desired band edge heights for the respective layers. The emitter and collector layers are preferably doped with silicon.

The photodetector is exposed to electromagnetic radiation, and in particular longwave length infrared radiation, having a polarization vector which forms an angle with the normal to the plane of the quantum well layer. For maximum efficiency this angle is 90 degrees which occurs with edge illumination of the quantum well layer. To increase power output, this angle can be reduced to expose more surface area of the quantum well layer to the radiation. Theoretical efficiencies of about 20% can be obtained even with an angle of incidence on the quantum well of about 45 degrees.

BRIEF DESCRIPTION OF THE DRAWING

A full understanding of the invention can be gained from the following description of the preferred embodiments when read in conjunction with the accompanying drawings in which.

DESCRIPTION OF THE PREFERRED EMBODIMENT

Figure 1:
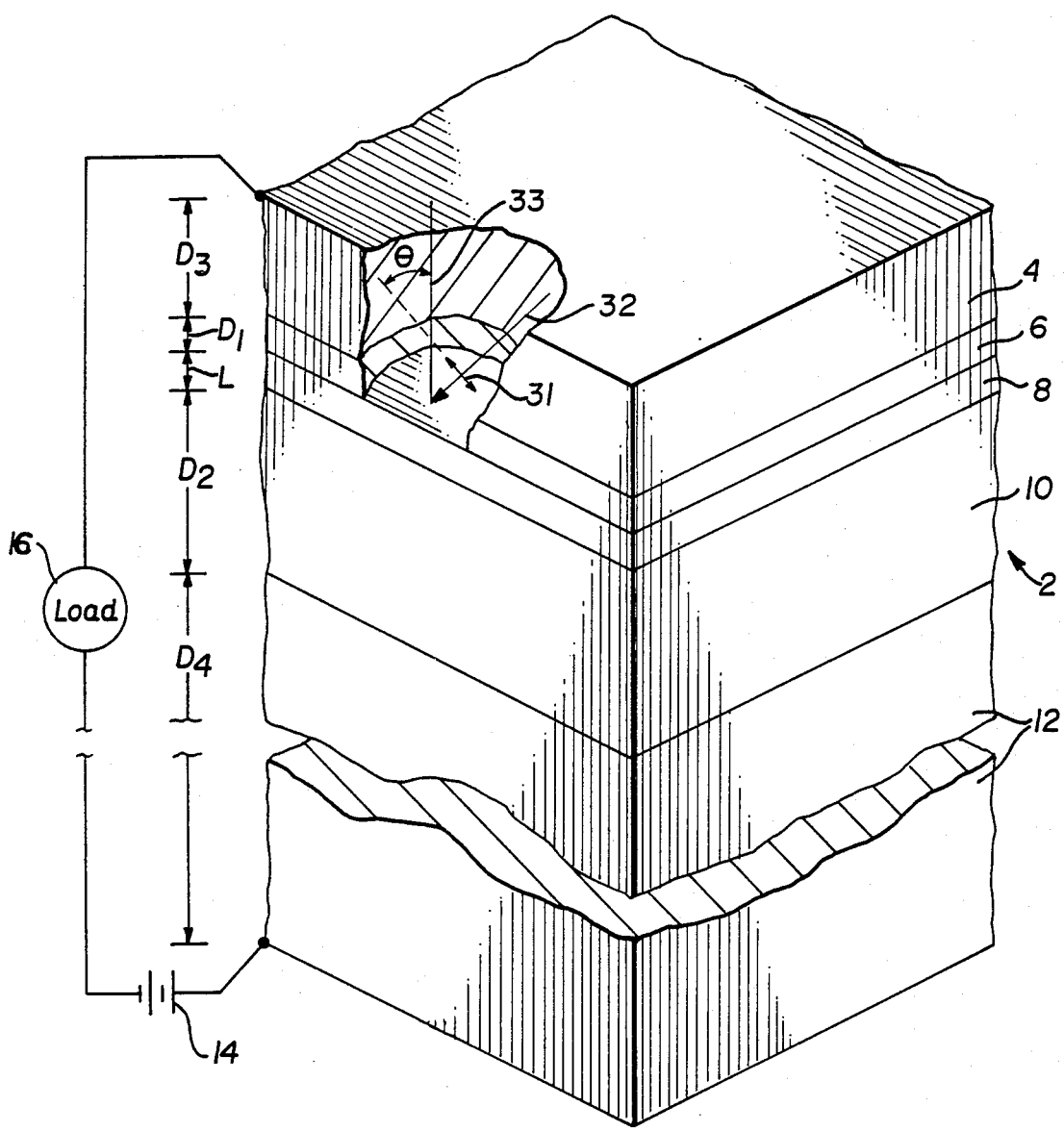
FIG. 1 is a partial, greatly magnified isometric view of a photodetector in accordance with the invention.

FIG. 1 illustrates a portion of a photodetector 2 in accordance with the invention. The photodetector 2 comprises multiple layers of semiconductor materials. These layers include, from top to bottom as shown in FIG. 1 an emitter layer 4, a first barrier layer 6, a quantum well layer 8, a second barrier layer 10 and a collector layer 12. These layers are very thin, for instance in a preferred form of the device described below the thickness $L_1$ *l of the quantum well layer 8 is only about* 70 angstroms. Hence, it is necessary to provide a substrate to give structural integrity to the device. This can be accomplished by making either the emitter layer 4 or the collector layer 12 a substrate. In the device shown in FIG. 1 the collector layer 12 forms the substrate and may typically have a thickness, $D_4$ of about 250 micrometers. It can be appreciated then that the device shown in FIG. 1 is greatly magnified.

The photodetection 2 is grown layer by layer using known techniques such as molecular beam epitaxy and metalorganic chemical vapor deposition. In the exemplary embodiment of the invention, the quantum well layer 8 consists essentially of gallium arsenide (GaAs), while the remaining layers consist essentially of selected aluminum, gallium arsenide alloys. In particular, the first barrier layer 6 consists essentially of $Al_{x1}Ga_{1-x1}As$, wherein $x_1$ equals 0 to 1, preferably about 0.51 to 0.53, and specifically 0.52. The second barrier layer 10 is composed essentially of $Al_{x2}Ga_{1-x2}As$, wherein $x_2$ equals 0 to 1, preferable about 0.47 to 0.49 and specifically 0.48. The emitter layer 4 is composed essentially of $Al_{x3}Ga_{1-x3}As$, wherein $x_3$ equals 0 to 1, and preferably about 0.14 to 0.16 and specifically 0.15. The emitter layer 4 is also doped with silicon as discussed below. Finally, the collector layer 12 is composed essentially of $Al_{x4}Ga_{1-x4}As$, wherein $x_4$ equals 0 to 1, preferably 0 to 0.02, and specifically 0.01. In the exemplary device, the collector layer 12 is heavily doped with silicon as also discussed below.

Figure 2:
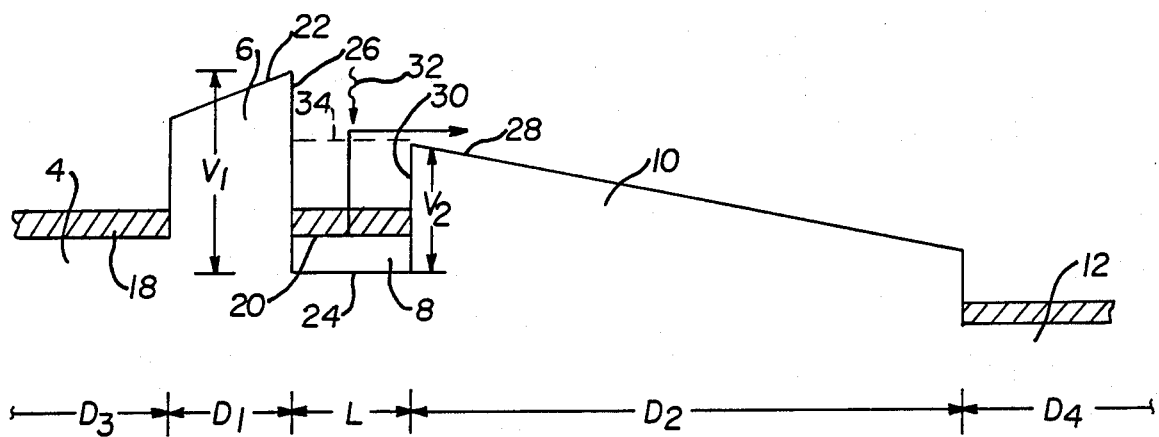
FIG. 2 is a schematic band diagram of the photodetector of FIG. 1 showing photoemission of an electron from the quantum well.

FIG. 2 illustrates a band diagram for the device of FIG. 1. In this Figure, the vertical direction represents the conduction band edge of the energy barrier of the semiconductor device at any particular point in the layers of the device which is represented by the horizontal location in the Figure.

Emitter 4 fills quantum well 8 by electron tunneling through the first barrier layer 6. The height, $V_1$, of the first energy barrier and thickness, $D_1$, of the barrier layer 6 are chosen to provide a tunneling rate equal to or greater than the photon pulse rate of the device. The inverse tunneling rate is the equilibration time for the Fermi levels 18 and 20 of the emitter layer 4 and quantum well 8 respectively. The emitter layer 4 can be doped with silicon so that the Fermi levels 18 and 20 equilibrate. Equilibration of the Fermi levels in the emitter layer 4 and quantum well 8 gives rise to the trapezoidal shape of the conduction band edge 22 of the barrier layer 6, and to self-alignment of the heights of the doped emitter layer impurity band 18 and the quantum well miniband 20. This self-alignment could reduce sensitivity of the device performance to device parameters and bias voltage.

After impurity band 18 and miniband 20 self align, resonant tunneling will take place. The doping of emitter layer 4 and the energy band height difference between Fermi level 18 of emitter layer 4 and Fermi level 20 of the quantum well 8 are chosen so as to maintain the desired equilibrium electron density in the well. The difference in energy levels between conduction band edge 24 inthe quantum well 8 and the band edge 22 at the interface 26 between the barrier layer 6 and quantum well 8, $V_1$, is chosen to be larger than the difference in energy levels between conduction band edge 24 and conduction band edge 28 of the the energy barrier in the second barrier layer 10 at the interface 30 with the quantum well 8, $V_2$, thereby determining the direction of electron flow from the quantum well 8 to the collector layer 12.

Theoretically, quantum efficiencies greater than about 20% are possible for electron densities greater than $10^{18}$ per cubic centimeter ($cm^3$) in quantum well 8. A theoretical quantum efficiency is dependent on the angle $\theta$ between the photon polarization vector, 31 of the incident light 32, and the normal 33 to the plane of quantum well layer 8 as shown in FIG. 1, with the maximum quantum efficiency corresponding to that angle being 0 degrees, which occurs with edge illumination. However, very little power can be generated from the small area exposed to the photons with edge illumination. It has been theorectically calculated that the angle $\theta$ can be 45 degrees as shown in FIG. 1, or more, and still yield 20% quantum efficiency. While the photons must penetrate the emitter and first barrier layers to reach the quantum layer 8, these layers are very thin and hence impose an insubstantial impediment to the photons reaching the quantum layer 8, and the much larger planar area exposed to the photons makes such angles more practical.

Means for optimizing the quantum efficiency include illumination near the Brewster angle, edge illumination, and front-side illumination with backside grating incorporated into the device. Thickness $D_2$ of barrier layer 10 is chosen to be large enough to maintain a low device capacitance, but small enough to provide low carrier transient time. The doping and thickness of the collector layer 12 are chosen to provide low resistance and thereby a short RC time constant for the device.

By choosing a set of ternary, $Al_xGa_{1-x}As$ (aluminum gallium arsenide) and possible quaternary $Al_xGa_{1-x}As_{1-y}P_y$ (aluminum gallium arsenide phosphide) alloy systems compatible with molecular beam epitaxy and metal organic chemical vaporization deposition fabrication techniques, it is possible to fabricate devices useful in infrared wave length ranges appropriate to new low loss fibers including those made from heavy metal fluorides. Because of barrier height limitations in convenient semiconductor materials, the detectors are limited to wavelengths greater than about 2 micrometers.

There is no similar restriction at long wavelengths, including 10.6 micrometers and beyond because the required quantum wells would be shallower. However, low operating temperatures, on the order of about 120 degrees Kelvin for 10 micrometer wavelengths, for example, would be desirable to avoid appreciable thermal excitation from shallower wells.

For a 20% quantum efficiency device designed to operate with 10 gigahertz (GHz) modulation of a 5 micrometer wavelength photon, the following are specific device parameters. The tunneling time for electrons into quantum well 8, through barrier layer 6 in FIG. 2 is estimated as:

$$\Delta t \simeq \frac{m^* L}{T^2 \hbar k} \text{ (approximate)}$$

wherein k is the component of the wave vector, 32, normal to the well inside the well 8, $m^*$ is the electron effective mass (about 0.07 times the free electron mass which is $9.1 \times 10^{-31}$ kilograms), $\hbar$ is the reduced Planck constant ($1.05 \times 10^{-34}$ joules-seconds), and $|T|^2$ is the transmission coefficient. For $D_1$ less than about 70 angstroms, $|T|^2$ is estimated to be greater than $5 \times 10^{-5}$, and from that the tunneling time would be less than or equal to 0.1 nanoseconds (ns).

Dark current tunneling from quantum well 8 through barrier layer 10 is found to be negligible for fields required to achieve the saturation drift velocity $v_s$, provided that $D_2$ is greater than about 125 angstroms. The transit time for electrons crossing barrier layer 10 can be estimated from $D_2/v_s$ by taking $v_s$ to be $10^7$ cm per second. For 10 GHz operation, the transit time upper bound on $D_2$ is 10 micrometers. Depending on the background impurity concentrations, full depletion of barrier layer 10 could favor $D_2$ less than 10 micrometers.

Specifically, the collector layer 12 may be a 250 micrometer thick, $D_4$, GaAs substrate with a $10^{18}/cm^3$ concentration of silicon. In terms of substrate resistance and device capacitance, the time constant is $RC = \rho \epsilon d/D_2$ where $\rho$ is the substrate resistivity, $\epsilon$ is the dielectric constant, and d is the substrate thickness ($D_4$ in the exemplary device). For 10 GHZ operation, the RC time constant lower bound on $D_2$ is about 75 angstroms; however $D_2$ should be greater than 125 angstroms due to the need to suppress tunneling out of the quantum well 8. In addition, electrical circuit impedance matching considerations may also dictate a larger $D_2$.

For quantum well 8, the fermi energy, $E_F$ and carrier density, n, are related by:

$$E_F = (\pi \hbar^2 L/m^*) n$$

For the carrier density n to be $10^{18}/cm^3$, $E_F$ is 15 meV. The Fermi energy for the three-dimensional electron sea in the emitter layer 4 is given by:

$$E'_F = \frac{\hbar^2}{2m^*} (3\pi^2 n')^{\frac{2}{3}}$$

which provides $1.5 \times 10^{17}/cm^3$ doping density for $E'_F$ equal to 15 meV, which is chosen to match $E_F$.

The thickness $D_3$ of the emitter layer 4 is not critical, but typically could be on the order of about one micrometer. Photons should be able to penetrate this layer and the barrier layer 6 to reach the quantum well layer 8.

The compositional control of $Al_xGa_{1-x}As$ needed to optimize the quantum efficiency requires that the accuracy in x to be less than or equal to about 0.01, with the most sensitive compositionally controlled parameter being, $V_2$, the conduction band edge height 28 at the interface 30 of barrier layer 20 with quantum well 8. For a deviation of x equal to 0.01, a deviation of about 8 meV in $V_2$ can be expected. From theoretical calculations, that would correspond to a degradation of quantum efficiency from 20% to 5%. The other device parameters are less critical.

The dark current, associated with thermionic emission of electrons from the quantum well, is estimated from a Richardson-Dushman like approach. Considering thermionic emission from a two-dimensional electron gas and including the effect of quantum mechanical reflection at interface 30 of barrier layer 20 with quantum well 8, the thermionic emission, J(T), current is found to be:

$$J(T) = (em^*/\pi^{3/2} \hbar^3)(KT)^2 (KT/V_2)^{1/2} \times$$
$$(e^{E_F/KT} - 1) e^{-(V_2 - E_0)/KT}$$

Where K is the Boltzmann constant and e is the electron charge. Shot noise associated with fluctuations in the thermionic emission current is estimated from the square root of the average number of electrons emitted per 100 picosecond (psec) time interval.

Figure 3:
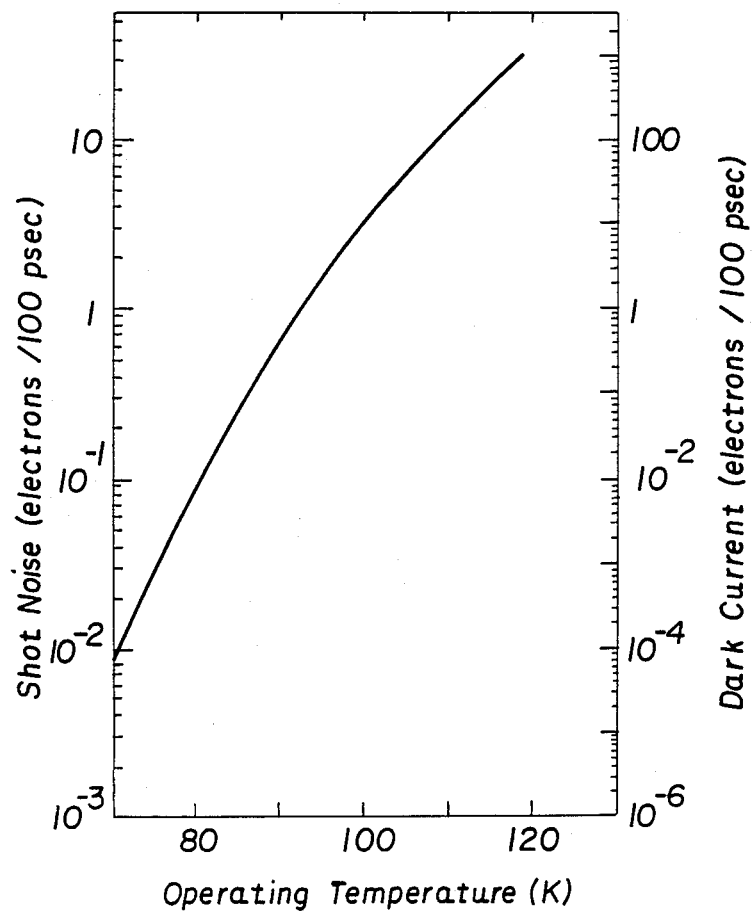
FIG. 3 is a plot of shot noise dark current versus operating temperature for the photodetector of FIG. 1.

The thermionic emission dark current and the shot noise for a cooled 1.0 square millimeter (mm) device are shown in FIG. 3. That figure shows that the dark current associated with the thermionic emission is negligibly small. For a power level range $100 \times 10^{-6}$ Watts to $100 \times 10^{-3}$ Watts on the detector, the number of electrons per bit ranges from $5 \times 10^4$ to $5 \times 10^7$ per 100 psec [*number of electrons per bit*=(*quantum efficiency*)$\times$(*power*)$\times$(*100 psec*)/(*photon energy*)]. Within the temperature range shown, the noise level is below 50 electrons per 100 psec. The probability of an error associated with the shot noise fluctuation depends exponentially on the ratio (number of electrons in a bit)/(Average number of electrons per 100 psec due to noise). Hence, the probability of an error for power range $100 \times 10^{-6}$ to $100 \times 10^{-3}$ Watts on the detector can be significantly less than one error per $10^{12}$ bits which represents a reasonable criterion for data transmission.

In operation, photodetector 2 is biased by dc source 14 with an electric field causing emitter layer 4 to be connected to a more negative electric potential then collector layer 12. The photodetector 2 is connected in series with a load device 16 across the dc source 14. The amount of biasing determines the slope of band edge 28 of barrier layer 10. The greater the potential difference between emitter layer 4 and collector layer 12, the greater the slope of band edge 28. As electron tunneling occurs from emitter layer 4, through barrier layer 6 and into quantum layer 8, those electrons become trapped within quantum well 8 as they do not have sufficient energy to surmount the barriers imposed by either barrier layer 6 or 10. As light is directed into quantum well 8, the photons in incident light 32 excite electrons from Fermi level 20 to energy level 34.

Energy level 34 is provided to optimize the discharge of electrons from quantum well 8. By generally aligning the height of energy level 34 with the height of the barrier imposed by barrier layer 10, electrons which are excited from Fermi level 20 to energy level 34 will then be capable of surmounting this barrier. To excite an electron from Fermi level 28 to energy level 34, it is necessary that individual photons of light have sufficient energy to excite a single electron. Although technically possible, it is not feasible to excite electrons by combining two or more low energy photons to create an additive effect. Therefore, if individual photons of light do not have sufficient energy to excite an electron from Fermi level 28 to energy level 34, electrons will remain trapped within quantum well 8. However, if energy level 34 is slightly below $V_2$ at the interface 30, electrons could tunnel through the barrier layer 10 due to the slope of the band edge 28. Thus it is only necessary that the excited state represented by level 34 be near the height the conduction band 28 of barrier layer 10 at interface 30.

When light, of sufficient energy to excite electrons from Fermi level 18 to energy level 34, falls within quantum well 8, electrons will surmount barrier 10. As this excitation lasts for only a brief moment, those electrons so excited will relax, moving along band edge 28 from barrier interface 30 to collector 12. If light is continuously applied to quantum well 8, a continuous stream of electrons will be excited out of quantum well 8 and travel along band edge 28 to collector 12. Barrier layer 6 is of such dimensions as to allow continuous tunneling of electrons from emitter 4 through barrier layer 6 to quantum well 8 at a rate sufficient to replace electrons depleted from the quantum well. Therefore, it is possible for photodetector 2 to continuously convert the energy of a light signal into electrical energy.

When used as a photodetector for high speed data communication, the pulsed light signal will cause a non-continuous stream of electrons to be excited out of the quantum well and flow to the collector. The rate at which electrons can tunnel through barrier layer 6 to the quantum well 8 is at least as great as the rate at which electrons are depleted from the quantum well by the pulsed light signal through photoemission, so that the device is suitable for use in real time digital communications systems. In particular, the exemplary device is suitable for a system with a 10 Ghz pulse rate.

It will be appreciated, therefore, that the present invention provides a unique apparatus for converting high speed, light encoded data into an electrical signal.

Whereas particular embodiments of the invention have been described for purposes of illustration, it will be evident to those skilled in the art that numerous variations of the details may be made without departing from the invention as defined in the appended claims.

We claim:

1. A photodetector comprising multiple layers of semiconductor material including:
   an emitter layer;
   a collector layer;
   a quantum well layer disposed between said emitter layer and collector layer;
   a first barrier layer between the emitter layer and the quantum well layer; and
   a second barrier layer between the collector layer and the quantum well layer;
   said first barrier layer having a band edge height establishing a first energy barrier which is higher than the band edge height of a second energy barrier established by the second barrier layer which in turn is higher than the Fermi level of the quantum well, and the thickness of the first barrier layer and height of the first energy barrier being such that electrons from the quantum well excited by photons flow from the quantum well through the second barrier layer but over the second energy barrier to the collector and are replaced by electrons which tunnel from the emitter layer through the first barrier layer to the quantum well layer, the thickness of said second barrier layer being such that non substantial proportion of the electrons in the quantum well tunnel through the second energy barrier.

2. The photodetector of claim 1 in which the composition of the layers and the thickness of the quantum well layer are selected such that electrons in the quantum well layer have an excited state which is approximately equal to the band edge height of said second energy barrier at the interface of the quantum well layer with the second barrier layer.

3. The photodetector of claim 2 in which the thickness and band edge height of the first energy barrier of the first barrier layer are sized to permit tunneling of electrons from said emitter layer to said quantum well layer at a rate which is at least as great as the rate of depletion of electrons from the quantum well layer by photo emission.

4. The photodetector of claim 3 in which said emitter layer is doped and the band edge height of the first energy barrier and thickness of the first barrier layer are such that the Fermi levels of the emitter layer and quantum well layer equilibrate.

5. The photodetector of claim 3 wherein the thickness of said second barrier layer is selected to provide a selected balance between low detector capacitance and low electron transit time, and wherein said collector layer is doped and of a thickness selected to provide with the second barrier layer a selected RC time constant for the photodetector.

6. The photodetector of claim 3 wherein said layers of said semiconductor materials consist essentially of gallium, arsenic and aluminum.

7. The photodetector of claim 6 wherein said quantum well layer consists essentially of GaAs, wherein said first barrier layer consists essentially of $Al_{x1}Ga_{1-x1}As$, and wherein said second barrier layer consists essentially of $Al_{x2}Ga_{1-x2}As$, with $x_1$ greater than $x_2$.

8. The photodetector of claim 7 wherein $x_1$ equals about 0.51 to 0.53 and $x_2$ equals about 0.47 to 0.49.

9. The photodetector of claim 7 wherein said emitter layer consists essentially $Al_{x3}Ga_{1-x3}As$ and wherein said collector layer consists essentially of $Al_{x4}Ga_{1-x4}As$, with $x_3$ greater than $x_4$ and less than $x_2$.

10. The photodetector of claim 9 wherein $x_1$ equals about 0.51 to 0.53, $x_2$ equals about 0.47 to 0.49, $x_3$ equals about 0.41 to 0.16, and $x_4$ equals about 0 to 0.02.

11. The photodetector of claim 10 adapted for use with about 10 gigahertz modulation of an about 5 micrometer wavelength carrier wherein the thickness of the first barrier layer is about 70 angstroms.

12. The photodetector of claim 11 wherein the thickness of the second barrier layer is between about 125 angstroms and 10 micrometers.

13. A method of converting light signals to electrical signals comprising:
   storing electrons in a quantum well layer of a semiconductor device between first and second barrier layers having first and second conduction band edge heights establishing first and second energy barriers respectively with the height of the first conduction band edge being higher than the second;
   exposing said quantum well layer to electromagnetic radiation having sufficient energy to eject stored electrons from said quantum well layer by photoemission;
   applying a bias voltage across an emitter layer adjacent the first barrier layer and a collector adjacent the second barrier layer to cause electrons ejected from the quantum well layer by photoemission to flow to the collector through the second barrier layer over the second energy barrier; and replacing the electrons ejected from the quantum well layer by photoemission with electrons which tunnel from said emitter layer through the first energy barrier of the first barrier layer to the quantum well layer.

14. The method of claim 13 wherein said replacing comprises replacing electrons ejected from the quantum well layer by photoemission with electrons which tunnel from said emitter layer through the the first energy barrier of the first barrier layer to the quantum well layer at a rate at least as great as the rate at which electrons are ejected from the quantum will layer by photo emission.

15. The method of claim 14 wherein ejecting electrons from said quantum well layer by photoemission comprises exciting the electrons to an energy level approximately equal to the conduction band edge height of the second energy barrier of the second barrier layer.

16. The method of claim 15 wherein ejecting electrons from said quantum well layer by exposing the quantum well layer to electromagnetic radiation comprises exposing said quantum well layer to electromagnetic radiation having a polarization vector which forms an angle with the normal to the plane of said quantum well layer.

17. The method of claim 16 wherein said polarization vector of said electromagnetic radiation forms an angle of about 90 degrees with the normal to the plane of the quantum well layer.

18. The method of claim 16 wherein said polarization vector of said electromagnetic radiation forms an angle of between 90 degrees and about 45 degrees to the normal to the plane of the quantum well layer.

* * * * *

UNITED STATES PATENT AND TRADEMARK OFFICE
CERTIFICATE OF CORRECTION

PATENT NO.  : 4,873,555

DATED       : October 10, 1989

INVENTOR(S) : DARRYL D. COON, RUNKIRI P. KARUNASIRI and HUI C. LIU

It is certified that error appears in the above-identified patent and that said Letters Patent is hereby corrected as shown below:

On the Title Page, col. 2, line 1, "Perlattices" should be --Superlattices--.

Col. 3, line 17 should read as follows:  -- thickness $L_1$ of the quantum well layer 8 is only about 70 ang- --.

Claim 1, col. 7, line 68, "non" should be --no--.

Claim 14, col. 9, line 15, "will" should be --well--.

Signed and Sealed this

Twenty-fifth Day of December, 1990

Attest:

HARRY F. MANBECK, JR.

*Attesting Officer*  *Commissioner of Patents and Trademarks*